(12) United States Patent
Perrott

(10) Patent No.: US 12,218,672 B2
(45) Date of Patent: Feb. 4, 2025

(54) FREQUENCY MULTIPLIER CALIBRATION

(71) Applicant: TEXAS INSTRUMENTS INCORPORATED, Dallas, TX (US)

(72) Inventor: Michael Henderson Perrott, Nashua, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/092,091

(22) Filed: Dec. 30, 2022

(65) Prior Publication Data
US 2024/0223170 A1    Jul. 4, 2024

(51) Int. Cl.
*H03K 5/14* (2014.01)
*H03K 5/00* (2006.01)
*H03L 7/08* (2006.01)

(52) U.S. Cl.
CPC ........... *H03K 5/14* (2013.01); *H03K 5/00006* (2013.01); *H03L 7/0807* (2013.01)

(58) Field of Classification Search
CPC ......... H03L 7/18; H03L 7/1976; H03L 7/081; H03L 7/087; H03L 7/0995; H03L 7/0891; H03L 7/06; H03L 7/08; H03L 7/085; H03L 7/0814; H03L 7/091; H03L 7/0816; H03L 7/0812; H03L 7/07; H03L 7/0807; H03K 5/14; H03K 5/00006; G06F 1/04; G06F 1/08; G06F 1/10; H04L 7/0331; H04L 7/033; H04L 7/0037
See application file for complete search history.

(56) References Cited

U.S. PATENT DOCUMENTS

| | | | | |
|---|---|---|---|---|
| 6,151,367 A | * | 11/2000 | Lim | ........................ H03J 7/04 |
| | | | | 375/326 |
| 9,973,178 B1 | * | 5/2018 | Holzmann | ......... H03K 5/00006 |
| 10,044,359 B1 | * | 8/2018 | Kim | ....................... H03L 7/083 |
| 11,101,808 B2 | * | 8/2021 | Gao | ..................... H03L 7/0992 |
| 2014/0035650 A1 | * | 2/2014 | Zerbe | ................... H03L 7/0995 |
| | | | | 327/299 |
| 2019/0007036 A1 | * | 1/2019 | Fu | ....................... H03K 5/1565 |
| 2019/0158075 A1 | * | 5/2019 | Lee | ....................... H03B 19/14 |

* cited by examiner

*Primary Examiner* — John W Poos
(74) *Attorney, Agent, or Firm* — Frank D. Cimino

(57) ABSTRACT

In some examples, an apparatus includes a delay-based frequency multiplier and an error detection circuit. The delay-based frequency multiplier has a clock input, a multiplier clock output, and a delay calibration input. The error detection circuit has a detection input and a detection output. The detection input is coupled to the multiplier clock output, and the detection output is coupled to the delay calibration input. The error detection circuit is configured to receive a clock signal at the detection input, and provide a period error signal at the detection output based on a time difference between a first edge of the clock signal and a second edge of a delayed version of the clock signal.

20 Claims, 13 Drawing Sheets

FREQUENCY MULTIPLIER CALIBRATION

RELATED APPLICATION

The present application is related to: U.S. Provisional Application No. 63/478,050, titled "DIGITAL-TO-TIME CONVERTER CALIBRATION," filed on Dec. 30, 2022, which is hereby incorporated herein by reference in their entireties.

BACKGROUND

Various electrical components in an electronic system operate at different clock frequencies. Such an electronic system may include a clock signal generator and a frequency multiplier. The clock signal generator can generate a first clock signal having a first frequency. Also, the frequency multiplier may generate a second clock signal having a second frequency that is a multiple of the first frequency, by multiplying the first frequency by a target multiplication factor. Due to various factors, such as process variations, operational conditions variations, (e.g., temperature and supply voltages) and noise, the frequency multiplier may introduce various errors to the second clock signal, such as frequency error and duty cycle error.

SUMMARY

In some examples, an apparatus includes a delay-based frequency multiplier and an error detection circuit. The delay-based frequency multiplier has a clock input, a multiplier clock output, and a delay calibration input. The error detection circuit has a detection input and a detection output. The detection input is coupled to the multiplier clock output, and the detection output is coupled to the delay calibration input. The error detection circuit is configured to receive a clock signal at the detection input, and provide a period error signal at the detection output based on a time difference between a first edge of the clock signal and a second edge of a delayed version of the clock signal.

In some examples, an apparatus includes a period error detection circuit and a frequency multiplier calibration circuit. The period error detection circuit has a clock input and an error detection output. The period error detection circuit includes a delay circuit and a time measurement circuit. The delay circuit has a signal input and a delay output, the signal input coupled to the clock input. The time measurement circuit has first and second measurement inputs, and a measurement output. The first measurement input is coupled to the clock input, the second measurement input is coupled to the delay output, and the measurement output is coupled to the error detection output. The frequency multiplier calibration circuit has an error input and a delay calibration output, the error input coupled to the error detection output.

BRIEF DESCRIPTION OF THE DRAWINGS

In this description, the same reference numbers depict same or similar (by function and/or structure) features. The drawings are not necessarily drawn to scale.

DETAILED DESCRIPTION

Figure 1:
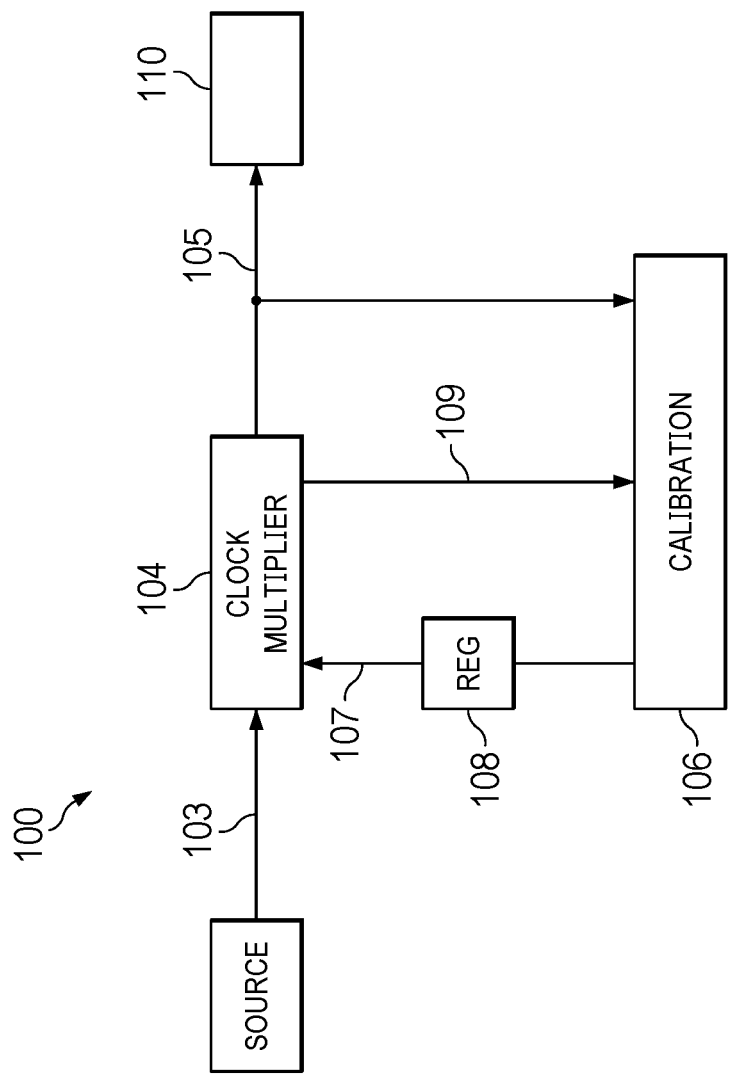
FIG. 1 is a schematic of a system having a clock multiplier and a calibration circuit, in accordance with various examples.

FIG. 1 is a schematic of a system 100 having a clock multiplier and a calibration circuit, in accordance with various examples. The system 100 may be any suitable device, the scope of which is not limited herein. For example, the system 100 may be a device in which it is useful to have a second clock signal having a second frequency that varies from a first frequency of a first clock signal, such as via frequency multiplication techniques. Accordingly, the system 100 includes a clock source 102 configured to provide a clock signal 103, and a clock multiplier 104 configured to provide a clock signal 105 by multiplying the frequency of clock signal 103. In some examples, clock source 102 can include an oscillator (not shown). The oscillator can be based on a bulk acoustic wave resonator (BAW), a crystal oscillator, etc. The clock multiplier 104 may include a delay-based frequency multiplier, as described herein. While a single clock multiplier 104 is shown in FIG. 1, in various examples multiple clock multipliers 104 of similar architecture may be coupled serially to increase an amount of frequency multiplication provided.

System 100 also includes a calibration circuit 106, which can be frequency multiplier calibration circuit. Calibration circuit 106 can receive clock signal 105 from clock multiplier 104. In various examples, the calibration circuit 106 receives clock signal 105, determines an error of clock signal 105 (e.g., a duty cycle error, a period error, etc.), and provides a calibration signal 107 back to clock multiplier 104 to correct or mitigate such error. In some examples, calibration signal 107 can include a set of digital values, and system 100 includes registers 108 to store the digital values and provide the digital values to clock multiplier 104. As to be described below, calibration circuit 106 may also receive a sync signal 109 from clock multiplier 104 to facilitate generation of calibration signal 107.

The system 100 also includes a component 110. Component 110 may be coupled to the output of clock multiplier 104 to receive clock signal 105 from clock multiplier 104. Component 110 can include various circuits that operate on clock signal 105, such as a radio transceiver, a frequency divider, a fractional output divider (FOD), a phase-locked loop (e.g., such as fractional-N or integer-N frequency synthesizer), a component useful in communication or providing other signaling, or any other component which may benefit from receiving clock signal 105 having a frequency that is a multiple of clock signal 103.

Figure 2A:
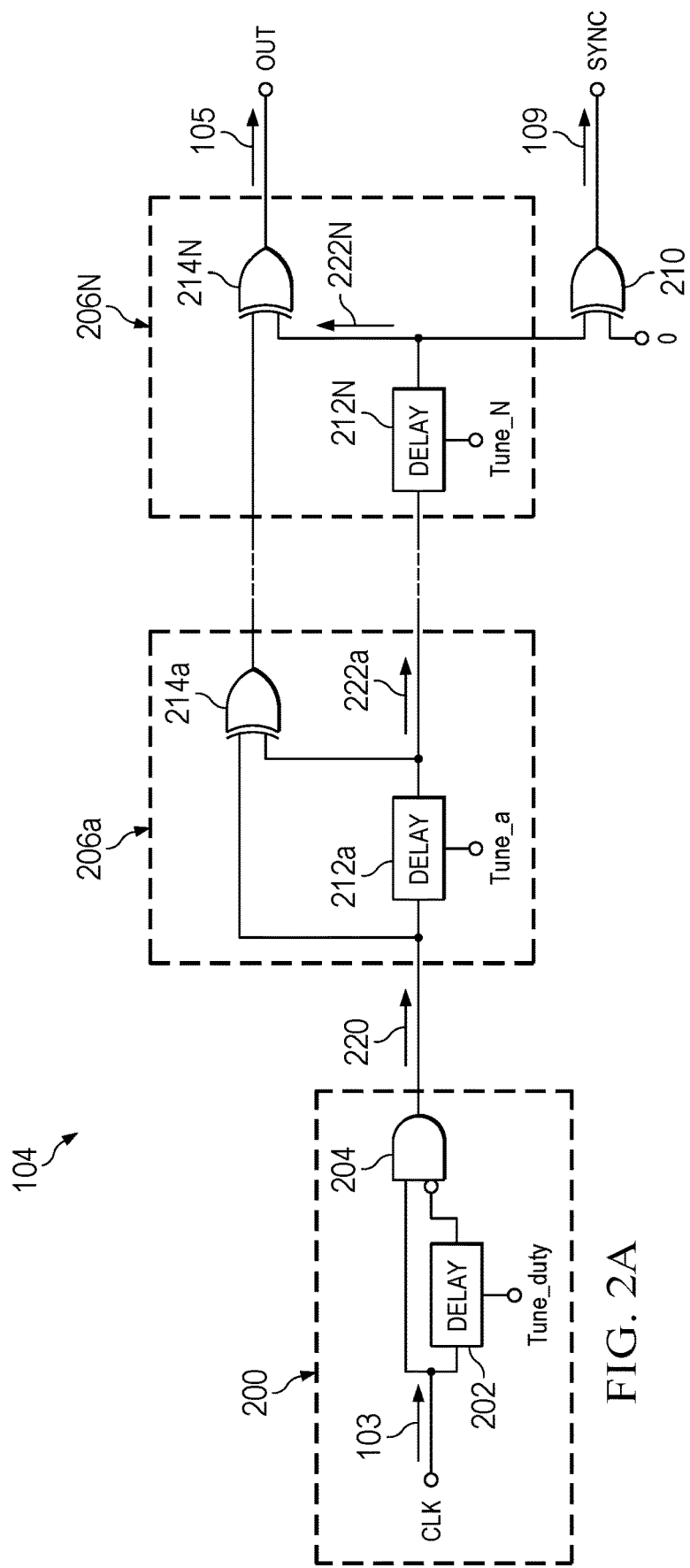
FIG. 2A is a schematic of a clock multiplier of FIG. 1, in accordance with various examples.

FIG. 2A is a schematic of the clock multiplier 104, in accordance with various examples. In an example, the clock multiplier 104 has a clock input (CLK) and a multiplier clock output (OUT). Clock input can receive an input clock signal (e.g., clock signal 103) having a first frequency. Clock multiplier 104 can generate an output clock signal (e.g., clock signal 105) at multiplier clock output having a second frequency that is a multiple of the first frequency. Clock multiplier 104 can be a delay-based frequency multiplier and includes a pulse generator circuit 200, which includes a delay circuit 202 and a logic circuit 204, and one or more multiplier stages 206, including multiplier stages 206a-206N. Each multiplier stage includes a delay circuit 212 (e.g., delay circuit 212a and 212N) and a logic circuit 214 (e.g., logic circuit 214a and 214N). Delay circuit 202 can be a pulse delay circuit and delay circuit 212 can be a multiplier delay circuit. They can have same, similar, or different topologies. Logic circuit 214 can form a clock combination circuit. In the example of FIG. 2A, logic circuit 204 can include an AND gate with an inverting input coupled to delay circuit 202. Also, logic circuit 214 can include an XOR gate.

Pulse generator circuit 200 and multiplier stages 206a-206N are serially connected between the clock input and the multiplier clock output. The input of pulse generator circuit 200 is coupled to the clock input. The output of pulse generator circuit 200 (and the output of logic circuit 204) is coupled to the input of multiplier stage 206a, which is coupled to a first input of logic circuit 214a and an input of delay circuit 212a. The output of delay circuit 212a is coupled to the input of delay circuit 212 of next multiplier stage (if such exists), which can be multiplier stage 206N in FIG. 2A, or another multiplier stage 206 not shown in FIG. 2A. The output of delay circuit 212a is also coupled to a second input of logic circuit 214a. The output of logic circuit 214a is coupled to the first input of logic circuit 214 of the next multiplier stage (if such exists), which can be multiplier stage 206N in FIG. 2A, or another multiplier stage 206 not shown in FIG. 2A. The output of the last multiplier stage (e.g., multiplier stage 206N in FIG. 2A) can be coupled to the multiplier clock output.

Clock multiplier 104 can multiply the first frequency of clock signal 103 (at CLK) by a multiplication factor to generate clock signal 105 at the second frequency. The frequency multiplication operation is performed by multiplier stages 206, and the number of multiplier stages 206 can set the multiplication factor. Specifically, pulse generator circuit 200 can generate a pulse signal 220 having the same frequency as clock signal 103 at CLK input, with the pulse width set by delay circuit 202.

Delay circuit 212a can generate a delayed version of pulse signal 220 as pulse signal 222a. The amount of delay provided by delay circuit 212a can be equal to a period of the output clock signal (e.g., clock signal 105) having the multiplied frequency. For example, for 2× frequency multiplication, the amount of delay is half of the period of the input clock signal. For 4× frequency multiplication, the amount of delay is a quarter of the period of the input clock signal. Also, for 2× frequency multiplication, clock multiplier 104 includes one multiplier stage 206, and the pulse is delayed once. For 4× frequency multiplication, clock multiplier 104 includes an additional multiplier stage 206 between multiplier stage 206a and 206N (not shown in FIG. 2A), and the pulse is delayed three times and becomes pulse signal 222N.

Pulse signals 220, 222a, and 222N (if such exists), each delayed in time by the period of the output clock signal 105, can be combined by logic circuit 214 (e.g., by an XOR operation) of each multiplier stage 206 to generate the output clock signal (e.g., clock signal 105). For 2× frequency multiplication, logic circuit 214a can combine the pulse signals 220 and 222a to generate the output clock signal 105. For 4× frequency multiplication, logic circuits 214 of the three multiplier stages 206 can combine pulse signals 220, 222a, 222b (from a multiplier stage 206b not shown in FIG. 2), and 222N to generate the output clock signal 105.

Figure 2B:
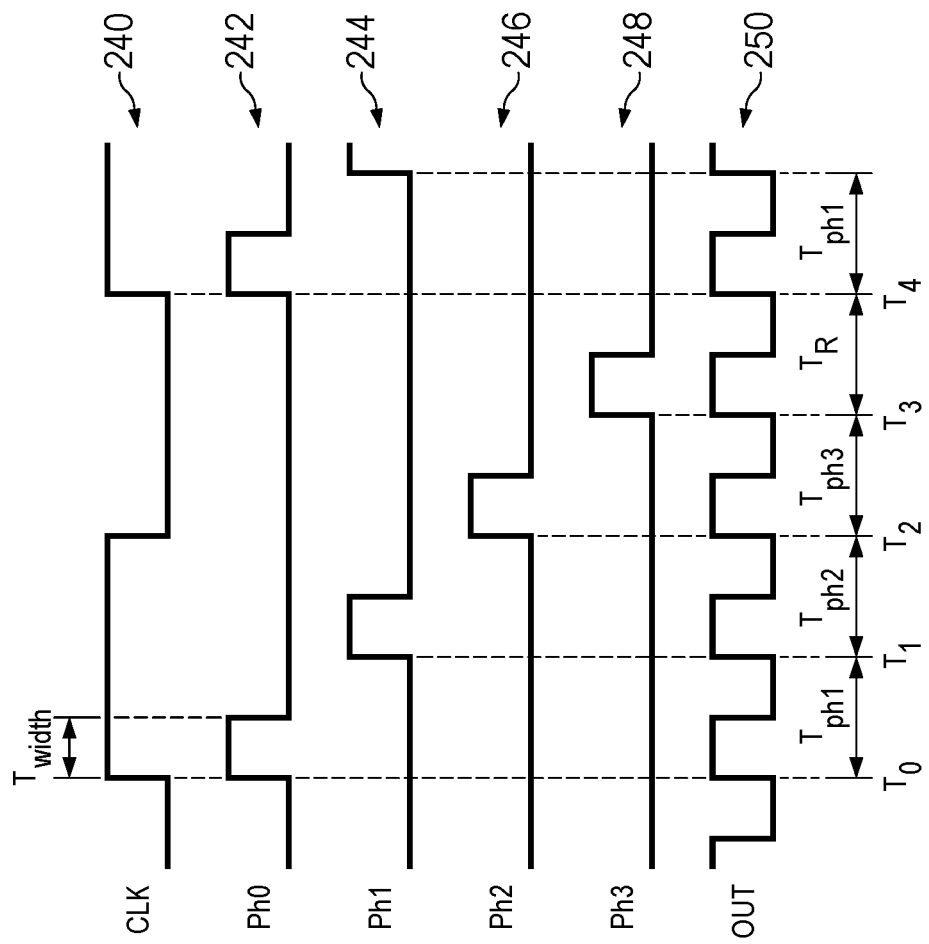
FIG. 2B includes graphs illustrating operations of the clock multiplier, in accordance with various examples.

FIG. 2B includes graphs that illustrate operations of clock multiplier 104 that provides 4× multiplication, in accordance with various examples. Graph 240 illustrates an example of clock signal 103 at CLK. Graphs 242, 244, 246, and 248 illustrate, respectively, examples of pulse signals 220, 222a, 222b, and 222N. Graph 250 illustrates an example of clock signal 105 at OUT. Referring to FIG. 2B, clock signal 103 can have a cycle period corresponding to the time difference between $T_0$ and $T_4$. Pulse generator circuit 200 can generate pulse signal 220 (also labelled Ph0 in FIG. 3) that can also have a cycle period corresponding to the time difference between $T_0$ and $T_4$, with the pulse width $T_{width}$ set by delay circuit 202. Delay circuit 212a of multiplier stage 206a can generate pulse signal 222a (also labelled Ph1) by delaying pulse signal 220 by a delay time of $T_{ph1}$. Also, delay circuit 212b of multiplier stage 206b can generate pulse signal 222b (also labelled Ph2) by delaying pulse signal 222a by a delay time of $T_{ph2}$. Further, delay circuit 212N of multiplier stage 206N can generate pulse signal 222N (also labelled Ph3) by delaying pulse signal 222b by a delay time of $T_{ph3}$. Logic circuits 214 can combine pulse signals 220, 222a, 222b, and 222N by XOR operations to generate clock signal 105. The number of multiplier stages 206, and each of delay times $T_{ph1}$, $T_{ph2}$, and $T_{ph3}$ can define a cycle period (and frequency) of clock signal 105. For 4× frequency multiplication, clock multiplier 104 can include three multiplier stages 206a, 206b, and 206c (or 206N). Each of $T_{ph1}$, $T_{ph2}$, and $T_{ph3}$ can be equal to a quarter of the cycle period of clock signal 103, and the last cycle period of clock signal 105 within the cycle period of clock signal 103, $T_R$, can also be equal to a quarter of the cycle period of clock signal 103. Also, clock signal 105 can have the same pulse width $T_{width}$ in each cycle, and the pulse width $T_{width}$ sets the duty cycle of clock signal 105.

Referring again to FIG. 2A, in some examples, the delay provided by each of delay circuits 202 and 212 is tunable. As described above, the delay provided by delay circuit 202 can set the pulse width ($T_{width}$) of the pulse signal 220, which in turn can set the duty cycle of the output clock signal 105. Also, the delay provided by delay circuits 212 can set delay times $T_{ph1}$, $T_{ph2}$, and $T_{ph3}$, and the number of multiplier stages 206 can set the frequency and cycle period of the output clock signal 105. Having the delays tuned allows correction/adjustment of the duty cycle and of the instantaneous periods of the output clock signal 105 in order to achieve low spurious content in the output clock signal 105 in the presence of mismatches (e.g., due to process variations) between multiplier stages 206 that are sensitive to operation conditions variations, (e.g., temperature and supply voltages). In FIG. 2A, delay circuit 202 can receive a tuning value for duty cycle (Tune_duty), and delay circuit 212 of each multiplier stage 206 can receive a tuning value to set the delay between the pulse and the delayed pulse, or between delayed pulses. For example, delay circuit 212a of multiplier stage 206a can receive a tuning value Tune_a, and delay circuit 212N of multiplier stage 206N can receive a tuning value Tune_N. Each tuning value can be in the form of an analog signal (e.g., a voltage, a current, etc.) having an amplitude that represents the tuning value, or in the form of a digital signal/code representing the tuning value. The tuning values can be received from calibration circuit 106 or from registers 108 between clock multiplier 104 and calibration circuit 106.

In some examples, each of delay circuits 202 and 212 can include a cascade of one or more inverters or buffers (not shown), and the tuning of the delay through the cascade of inverters or buffer is implemented by adjusting the rise and/or fall times of one or more of the inverters or buffers. In some examples, adjustment of the rise and/or fall times of one more of the inverters of buffers is implemented via an adjustable capacitance (not shown) at the output node of the respective inverter(s) or buffer(s). In some examples, the adjustment of capacitance is implemented based on an analog tuning voltage representing the tuning values, such as in examples in which the adjustable capacitance is implemented as a varactor. In other examples, the adjustment of capacitance can be implemented with a digital tuning value, such as in examples in which the adjustable capacitance is implemented as a set of capacitors and switches such that a variable number of capacitors can be switched in according to the digital tuning value. In other examples, the tuning of the delay through the cascade of inverters or buffers is implemented by selectively multiplexing a different number of inverters into the delay path according to a digital coarse tuning value, while adjustable capacitance may be adjusted according to a fine tuning value.

In addition, clock multiplier 104 has a SYNC output to provide sync signal 109. Clock multiplier 104 can provide sync signal 109 to calibration circuit 106. As to be described below, calibration circuit 106 can determine an instantaneous cycle period error of the output clock signal 105 resulting from the delay time between delayed pulses provided by the multiplier stages 206 not matching a target cycle period of the output clock signal 105. Based on sync signal 109, calibration circuit 106 can map a cycle period error to a particular delay time between delayed pulses provided by a particular multiplier stage 206, and adjust the tuning value for the delay of that multiplier stage 206 based on the cycle period error. In some examples, clock multiplier 104 can provide sync signal 109 based on the pulse signal from any multiplier stage 206, including the last multiplier stage 206 as indicated in FIG. 2A, so that sync signal 109 can align with one of the N cycles (with cycle period $T_{ph1}$ or $T_{ph2}$ or $T_{ph3}$ or $T_R$ for case of N=4 for 4× frequency multiplication) of a new set of cycles of clock signal 105. In other examples, clock multiplier 104 can provide sync signal 109 based on the pulse signal from the pulse generator circuit 200 so that sync signal 109 can align with a first cycle (e.g., with cycle period $T_{ph1}$) of a new set of cycles of clock signal 105. In some examples, as shown in FIG. 2A, clock multiplier 104 can include a logic circuit 210 (e.g., an XOR gate) coupled between multiplier stage 206N and the SYNC output to generate sync signal 109. Such arrangements can improve delay matching between clock signal 105 and sync signal 109 and relax the timing requirements of calibration circuit 106, which operates on clock signal 105 and sync signal 109.

Figure 3:
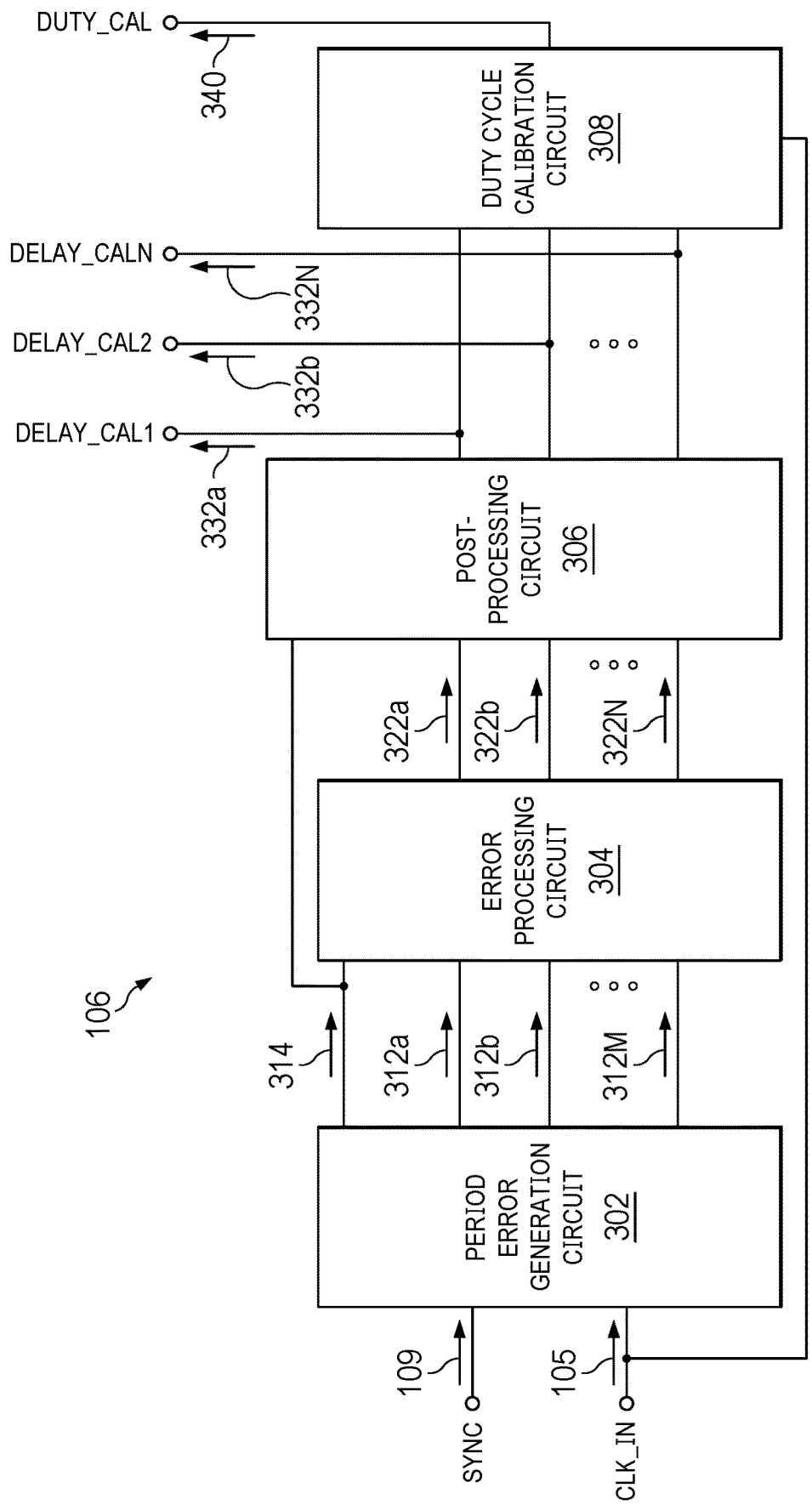
FIG. 3 is a schematic of a calibration circuit of FIG. 1, in accordance with various examples.

FIG. 3 is a schematic illustrating internal components of calibration circuit 106, in accordance with various examples. Referring to FIG. 3, calibration circuit 106 includes a period error generation circuit 302, an error processing circuit 304, a post-processing circuit 306, and a duty cycle calibration circuit 308. In some examples, one or more components of calibration circuit 106 are external. Various components of calibration circuit 106 can be implemented on an application specific integrated circuit (ASIC), a programmable logic device (e.g., field programmable gate array (FPGA)), or any other customized circuit blocks. In some examples, a processor (e.g., a microcontroller) can execute instructions to implement various functions of calibration circuit 106. Calibration circuit 106 can include a CLK_IN input to receive clock signal 105, a SYNC input to receive sync signal 109, and DELAY_CAL outputs and DUTY_CAL outputs to provide calibration signals.

Period error generation circuit 302 can receive clock signal 105 from clock multiplier 104 via CLK_IN and detect cycle period errors in clock signal 105. A cycle period error can represent a deviation of a particular cycle period of clock signal 105 from a target cycle period. For example, if clock multiplier 104 provides 2× frequency multiplication, the target cycle period can be half of the cycle period of clock signal 103 provided by clock source 102. Also, if clock multiplier 104 provides 4× frequency multiplication, the target cycle period can be a quarter of the cycle period of clock signal 103. As to be described below, period error generation circuit 302 includes a tunable delay circuit and a time measurement circuit, and can detect and measure a cycle period error by measuring a time difference between an edge of clock signal 105 and an edge of a delayed version of clock signal 105. Such arrangements can reduce the complexity of circuits involved in the cycle period error measurements and calibration signal generations relative to more complex circuits such as phase-locked loops, which can also reduce power consumption. Period error generation circuit 302 can provide an error signal 312 representing a measurement result of the cycle period error.

Also, period error generation circuit 302 can receive sync signal 109 from clock multiplier 104. As described above, period error generation circuit 302 can determine a cycle period error of the output clock signal 105 resulting from the delay time between delayed pulses provided by the multiplier stages 206 not matching the target cycle period of the output clock signal 105, and provide error signal 312 representing the cycle period error. Based on sync signal 109, period error generation circuit 302 can determine which cycle period the cycle period error belongs to, and generate an error signal 312 for that cycle period. In the example of FIG. 3, for N multiplier stages and N+1 cycle periods, period error generation circuit 302 can generate error signal 312a, 312b, . . . 312M, where M equals N+1 and corresponds to the multiplication factor. For example, if clock multiplier 104 supports 4× frequency multiplication operation, M equals four. Referring again to FIG. 2B, in a case where clock multiplier 104 provides 4× frequency multiplication, error signal 312a can represent the cycle period error for $T_{ph1}$, error signal 312b can represent the cycle period error for $T_{ph2}$, error signal 312c (not shown in FIG. 3) can represent the cycle period error for $T_{ph3}$, and error signal 312d (not shown in FIG. 3) can represent the cycle period error for $T_R$. Period error generation circuit 302 can also generate an internal clock signal 314 based on sync signal 109 to synchronize the operations of period error generation circuit 302, error processing circuit 304, and post-processing circuit 306.

Also, error processing circuit 304 can receive error signal 312 and internal clock signal 314, and generate processed signals 322a, 322b, . . . 322N each targeted at a particular cycle period and a particular multiplier stage 206. Post-processing circuit 306 can then generate delay calibration signal 332a based on processed signal 322a, delay calibration signal 332b based on processed signal 322b, and delay calibration signal 332N based on processed signal 322N. Delay calibration signals 332a, 332b, and 332N are part of calibration signal 107 of FIG. 1 and include tuning values such as Tune_a and Tune_N of FIG. 2A. Calibration circuit 106 can transmit delay calibration signal 332a via DELAY_CAL1 output to calibrate multiplier stage 206a, transmit delay calibration signal 332b via DELAY_CAL2 output to calibrate multiplier stage 206b, and transmit delay calibration signal 332N via DELAY_CALN output to calibrate multiplier stage 206N. The delay calibration signals can be transmitted directly to clock multiplier 104, or via registers 108.

In a case where clock multiplier 104 provides 4× frequency multiplication, processed signal 322a can target at $T_{ph1}$ (and multiplier stage 206a), processed signal 322b can target at $T_{ph2}$ (and multiplier stage 206b), and processed signal 322N can target at $T_{ph3}$ (and multiplier stage 206N). In a case where clock multiplier 104 has N multiplier stages, error processing circuit 304 can generate N processed signals 322, and post-processing circuit 306 can generate N delay calibration signals 332, each targeted at a respective multiplier stage 206.

As to be described below, in some examples, error processing circuit 304 can generate a processed signal 322 for a particular cycle period by subtracting between the period cycle error of a given cycle period (as an example, $T_R$, represented by error signal 312M) and the period cycle error of a different cycle period (e.g., $T_{ph1}$, $T_{ph2}$, $T_{ph3}$ represented by respectively error signals 312a, 312b, and 312c). Such arrangements can improve the convergence behavior of the delay tuning for the delays in the multiplier stages. As to be described below, one example source of such improvement is in the presence of an initially untuned delay circuit of period error generation circuit 302, such as during initial power up of the calibration circuit.

In addition, calibration circuit 106 also includes duty cycle calibration circuit 308. Duty cycle calibration circuit 308 can provide a duty cycle calibration signal 340 via DUTY_CAL output to tune the delay of delay circuit 202 of pulse generator circuit 200. Duty cycle calibration signal 340 can be part of calibration signal 107 of FIG. 1 and can include the Tune_duty value of FIG. 2A. As described above, the delay provided by delay circuit 202 can set the duty cycle of clock signal 105. Accordingly, duty cycle calibration signal 340 can set the duty cycle of clock signal 105 by setting the delay of delay circuit 202.

Duty cycle calibration circuit 308 can generate duty cycle calibration signal 340 based on various sources. In some examples, duty cycle calibration circuit 308 can generate duty cycle calibration signal 340 based on one or more of delay calibration signals 332. For example, if delay circuit 202 has similar circuit topology and tuning mechanism as delay circuits 212, duty cycle calibration circuit 308 can generate duty cycle calibration signal 340 based on a scaled version of delay calibration signals 332. Specifically, to achieve a duty cycle of 50%, the delay provided by delay circuit 202 can be half of the delay provided by delay circuit 212, and the tune value (e.g., to select capacitive loading) of delay circuit 202 can be scaled relative to the tune value of delay circuit 212 to reflect the halved delay. In some examples, duty cycle calibration circuit 308 can receive clock signal 105, and generate duty cycle calibration signal 340 by measuring the duty cycle of clock signal 105. Duty cycle calibration circuit 308 can measure the duty cycle using various techniques. For example, duty cycle calibration circuit 308 can include a duty cycle measurement circuit (not shown in FIG. 3) to measure the average voltage of clock signal 105 relative to the signal swing of clock signal 105. Since the average voltage of clock signal 105 will be half of the signal swing of clock signal 105 in the case of even duty cycle (50% duty cycle), duty cycle calibration signal 340 can be adjusted such that the average voltage of clock signal 105 is tuned in order to achieve even duty cycle. Examples of a duty cycle measurement circuit can include a filter (e.g., a resistor-capacitor (RC) filter), etc., that can provide an average voltage of clock signal 105.

Figure 4A:
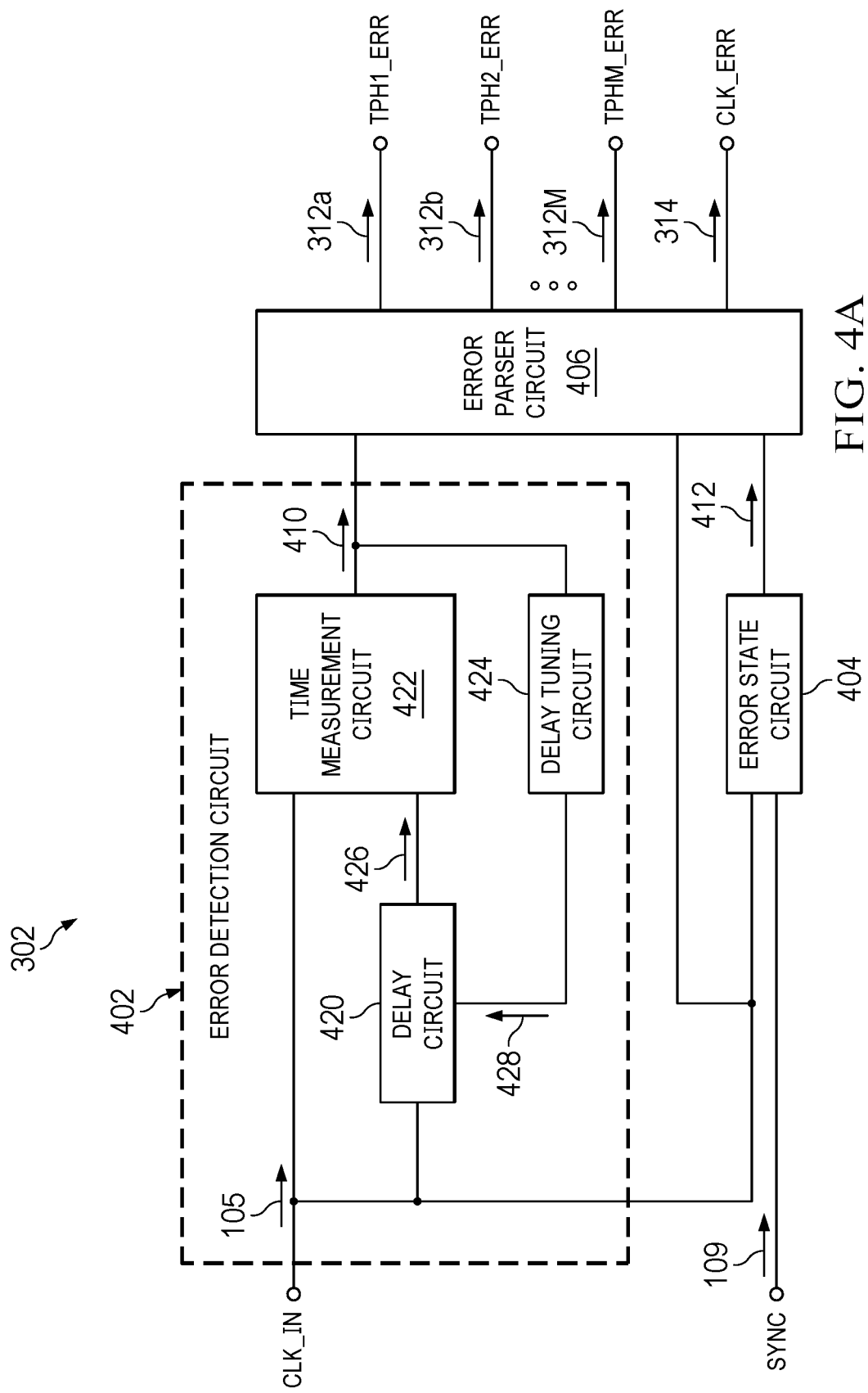
FIG. 4A is a schematic of internal components of the calibration circuit of FIG. 1, and FIGS. 4B and 4C include graphs to illustrate operations of the calibration circuit, in accordance with various examples.
Figure 4B:
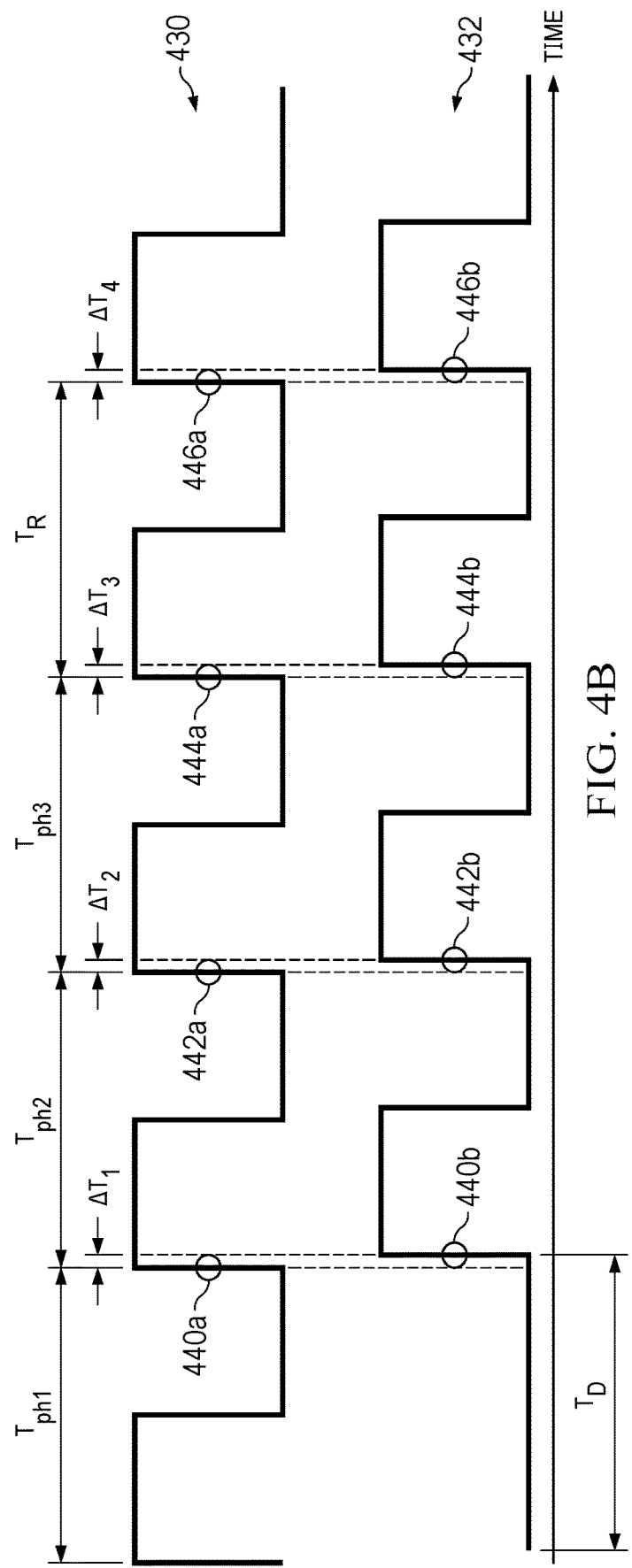
Figure 4C:
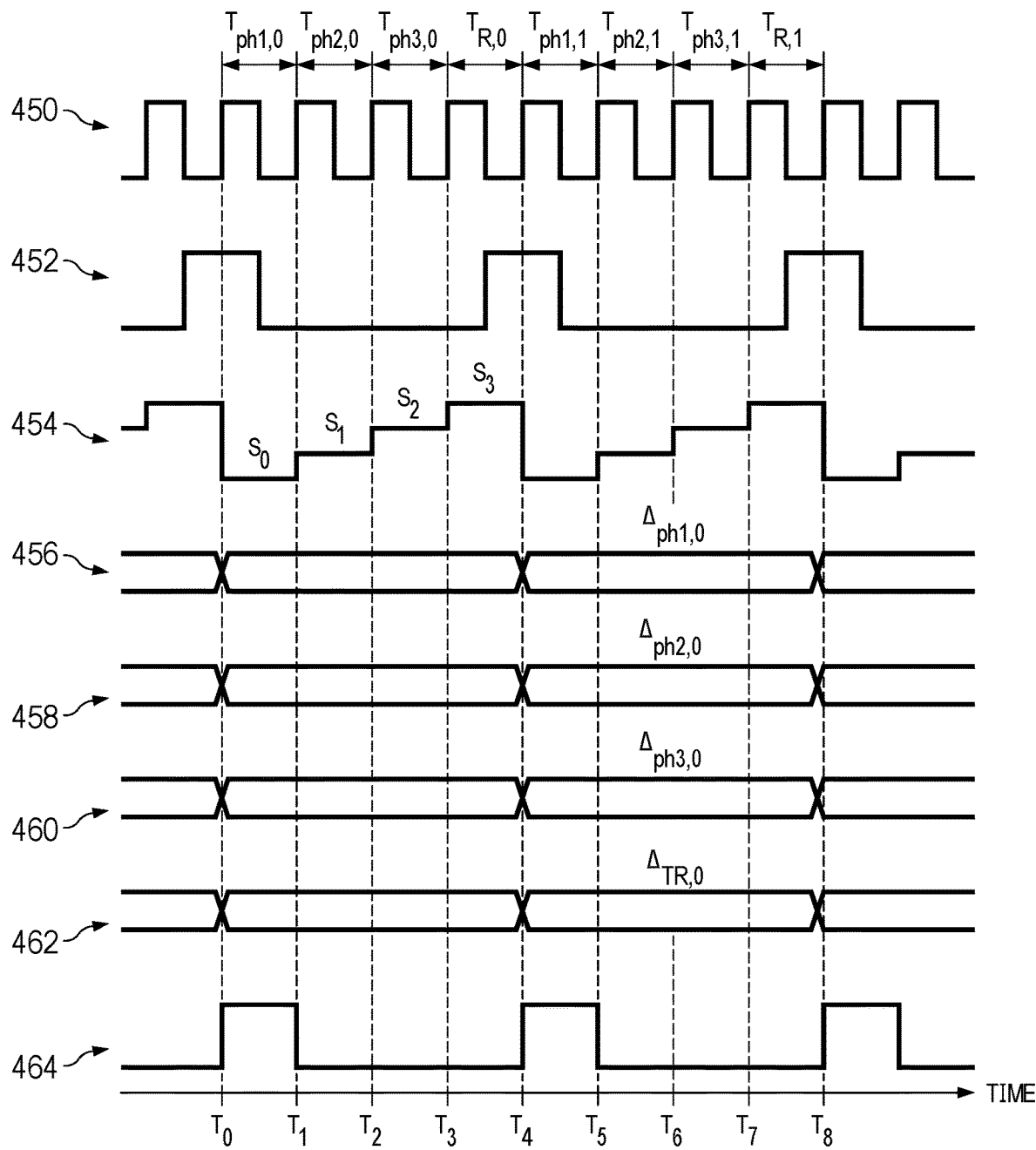

FIG. 4A is a schematic illustrating internal components of period error generation circuit 302, and FIG. 4B and FIG. 4C include graphs that illustrate example operations of period error generation circuit 302, in accordance with various examples. Referring to FIG. 4A, period error generation circuit 302 includes an error detection circuit 402, an error state circuit 404, and an error parser circuit 406. Error detection circuit can receive clock signal 105 and generate an error signal 410, which may be referred to as a period error signal, representing a cycle period error of clock signal 105, and can update error signal 410 for different cycle periods. Error state circuit 404 can receive sync signal 109 and clock signal 105, and generate an error state signal 412 indicating which cycle period (e.g., $T_{ph1}$, $T_{ph2}$, $T_{ph3}$, $T_R$) a particular error signal 410 belongs to. Error state circuit 404 can set error state signal 412 at an initial state responsive to sync signal 109, and then update error state signal 412 in each cycle of clock signal 105. Error parser circuit 406 receives a sequence of error signals 410, a sequence of error state signals 412, and clock signal 105, and selectively routes error signals 410 to TPH1_ERR, TPH2_ERR, ... TM_ERR as the respective error signals 312, 312b, ... 312M by mapping the error signals to the cycle periods. Error parser circuit 406 can also route clock signal 105 to CLK_ERR as clock signal 314 that is appropriately aligned in time to error signals TPH1_ERR, TPH2_ERR, TM_ERR in order that error processing circuit 304 and post-processing circuit 306 can utilize the lower speed clock signal 314 (compared to CLK_IN, which is N times higher in frequency) for error processing, while avoiding timing errors in receiving and performing digital signal processing of error signals TPH1_ERR, TPH2_ERR, TM_ERR.

Figure 5:
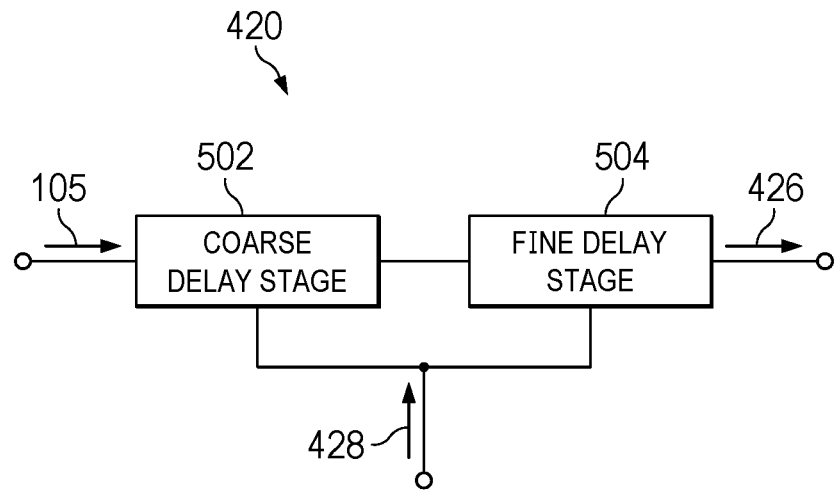
FIGS. 5, 6, and 7 are schematics of internal components of the calibration circuit of FIG. 1, in accordance with various examples.
Figure 6:
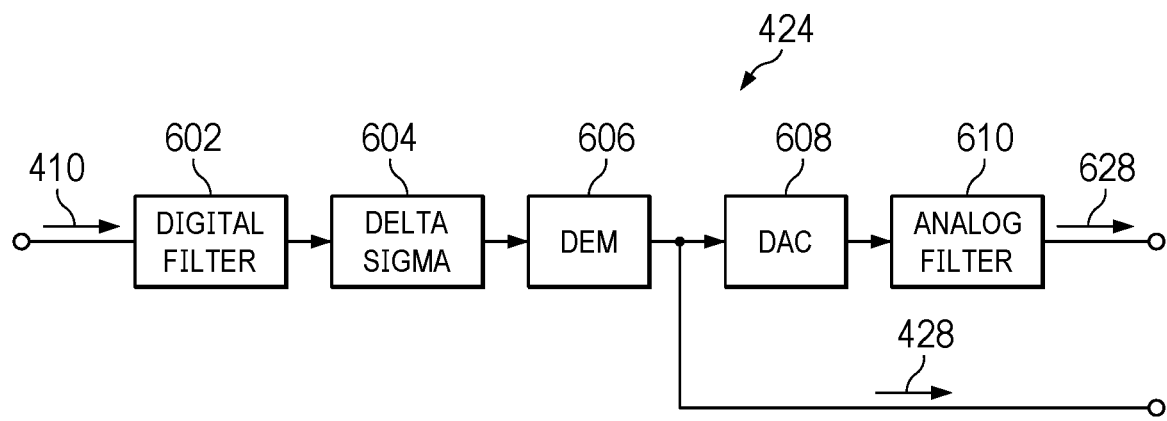

Specifically, error detection circuit 402 includes a period delay circuit/delay circuit 420, a time measurement circuit 422, and a delay tuning circuit 424. Delay circuit 420 can have an input coupled to CLK_IN to receive clock signal 105, and generate clock signal 426 as a delayed version of clock signal 105. Delay circuit 420 can delay clock signal 105 by a delay $T_D$ that corresponds to a target cycle period of clock signal 105. Delay circuit 420 can receive a control signal 428 from delay tuning circuit 424 to set delay $T_D$. In some examples, delay tuning circuit 424 can set delay $T_D$ based on a distribution of cycle period errors in error signals 410. For example, delay tuning circuit 424 can set delay $T_D$ so that the cycle period errors center around an average error value (e.g., zero) rather than skewing away from the average error value. Delay tune circuit 424 may include a digital decimator and accumulator (not shown) to down-sample and accumulate the cycle period errors to determine average error values across multiple cycle periods, as well as additional filters (not shown). Delay tune circuit 424 may also include a delta-sigma circuit (not shown) to process the average error values to reduce the data size of the error values and to shape the noise. In some examples, delay tuning circuit 424 can provide control signal 428 including a set of digital values representing the output of the accumulator, filtered accumulator, or delta-sigma circuit to delay circuit 420 to set delay $T_D$. In some examples, delay tuning circuit 424 can include a digital-to-analog converter (DAC) and an analog filter (neither shown) to convert the digital values to an analog signal, and provide the analog signal as control signal 428. Example internal components of delay circuit 420 are illustrated in FIG. 5, and example internal components of delay tuning circuit 424 are illustrated in FIG. 6, as to be described below.

Time measurement circuit 422 can have a first input coupled to CLK_IN to receive clock signal 105, and a second input coupled to the output of delay circuit 420 to receive clock signal 426. Time measurement circuit 422 can measure a time difference between an edge of clock signal 105 and an edge of clock signal 426 (e.g., a delayed version of clock signal 105). The time difference can represent a deviation of a cycle period from the target cycle period as a cycle period error. In some examples, time measurement circuit 422 can include a time-to-digital converter circuit. In some examples, time measurement circuit 422 can include a bang-bang detector circuit (not shown), which allows a high precision and a high-speed operation, while the non-linear characteristic of the bang-bang detector circuit, combined with jitter, can be attenuated after averaging.

FIG. 4B includes graphs 430 and 432 that illustrate operations of error detection circuit 402 in a case where clock multiplier 104 provides 4× frequency multiplication, in accordance with various examples. Graph 430 represents clock signal 105, and graph 432 represents clock signal 426, which is delayed from clock signal 105 by the delay $T_D$. With delay $T_D$ equal to a target cycle period, time measurement circuit 422 can measure a first time difference ($\Delta T_1$ in FIG. 4B) between the edges 440a of clock signal 105 and edge 440b of clock signal 426 as the deviation of $T_{ph1}$ from $T_D$, and provide the first time difference in error signal 410. In some examples, the first time difference $\Delta T_1$ can also indicate whether edge 440a leads or lags behind edge 440b. Time measurement circuit 422 can also measure a second time difference ($\Delta T_2$ in FIG. 4B) between the edge 442a of clock signal 105 and edge 442b of clock signal 426 as the deviation of $T_{ph2}$ from $T_D$, and provide the second time difference in error signal 410. In some examples, the second time difference $\Delta T_2$ can also indicate whether edge 442a leads or lags behind edge 442b. Time measurement circuit 422 can also measure a third time difference ($\Delta T_3$ in FIG. 4B) between edge 444a of clock signal 105 and edge 444b of clock signal 426 as the deviation of $T_{ph3}$ from $T_D$, and provide the third time difference in error signal 410. In some examples, the third time difference $\Delta T_3$ can also indicate whether edge 444a leads or lags behind edge 444b. Further, time measurement circuit 422 can also measure a fourth time difference ($\Delta T_4$ in FIG. 4B) between edge 446a of clock signal 105 and edge 446b of clock signal 426 as the deviation of $T_R$ from $T_D$, and provide the fourth time difference in error signal 410. In some examples, the fourth time difference $\Delta T_4$ can also indicate whether edge 446a leads or lags behind edge 446b.

FIG. 4C includes graphs 450-464 that illustrate operations of error state circuit 404 and error parser circuit 406, in a case where clock multiplier 104 provides 4× frequency multiplication, in accordance with various examples. Graph 450 represents clock signal 105, graph 452 represents sync signal 109, graph 454 represents error state signal 412, graph 456 represents error signal 312a, graph 458 represents error signal 312b, graph 460 represents error signal 312c, graph 462 represents error signal 312d, and graph 464 represents internal clock signal 314 to synchronize the operations of error processing circuit 304 and post-processing circuit 306. In some examples, internal clock signal 314 is shifted in time and has a certain duty cycle (e.g., 50%) to better avoid timing issues such as metastability in the error processing circuit 304 which receives error signals 312.

Between time $T_0$ and $T_4$, error state circuit 404 receives a first set of cycles of clock signal 105 including a first cycle having the cycle period $T_{ph1,0}$ between $T_0$ and $T_1$, a second cycle having a cycle period $T_{ph2,0}$ between $T_1$ and $T_2$, a third cycle having a cycle period $T_{ph3,0}$ between $T_2$ and $T_3$, and a fourth cycle having a cycle period $T_{R,0}$ between $T_3$ and $T_4$. Between $T_4$ and $T_8$ error state circuit 404 receives a second set of cycles of clock signal 105 including a first cycle having a cycle period $T_{ph1,1}$ between $T_4$ and $T_5$, a second cycle having a cycle period $T_{ph2,1}$ between $T_6$ and $T_6$, a third cycle having a cycle period $T_{ph3,1}$ between $T_6$ and $T_7$, and a fourth cycle having a cycle period $T_{R,1}$ between $T_7$ and $T_8$.

Between time $T_0$ and $T_1$, error state circuit 404 receives a first cycle of clock signal 105 (having the cycle period $T_{ph1}$), and provides a state signal 412 having a state of $S_0$. Error parser circuit 406 also receives state signal 412 having the $S_0$ state and error signal 410. Responsive to state signal 412 having the $S_0$ state, error parser circuit 406 can store error signal 410 received between $T_0$ and $T_1$ representing an error of $T_{ph1,0}$ ($\Delta T_{ph1,0}$) at $T_0$.

Error state circuit 404 can also receive an asserted sync signal 109 indicating that error signal 410 received between time $T_0$ and $T_1$ corresponds to cycle period $T_{ph1}$. Responsive to receiving an asserted sync signal 109, error parser circuit 406 can assert internal clock signal 314, and provide error signals 312a, 312b, 312c, and 312d representing the period errors of a prior set of cycles of clock signal 105. The assertion of internal clock signal 314 (or the rising edge) can signal to error processing circuit 304 and post-processing circuit 306 that the error parser circuit 406 has finished providing the error signals for all multiplier stages (e.g., for multiplier stages 206a-206N) for the prior set of cycles, and error processing circuit 304 can process error signals 312a, 312b, 312c, and 312d provided by error parser circuit 406.

Between time $T_1$ and $T_2$, error state circuit 404 receives a second cycle of clock signal 105 (having the cycle period $T_{ph2,0}$). Responsive to receiving the second cycle, error state circuit 404 can provide a state signal 412 having a state of $S_1$. Error parser circuit 406 also receives state signal 412 having the $S_1$ state and error signal 410. Responsive to state signal 412 having the $S_1$ state, error parser circuit 406 can store error signal 410 received between $T_1$ and $T_2$ representing an error of $T_{ph2,0}$ ($\Delta T_{ph2,0}$) at $T_1$. In some examples, error state circuit 404 also deasserts internal clock signal 314. In other examples, internal clock signal 314 may be de-asserted in a later error state in order to achieve a desired duty cycle for internal clock signal 314.

Between time $T_2$ and $T_3$, error state circuit 404 receives a third cycle of clock signal 105 (having the cycle period $T_{ph3,0}$). Responsive to receiving the third cycle, error state circuit 404 can provide a state signal 412 having a state of $S_2$. Error parser circuit 406 also receives state signal 412 having the $S_2$ state and error signal 410. Responsive to state signal 412 having the $S_2$ state, error parser circuit 406 can store error signal 410 received between $T_2$ and $T_3$ representing an error of $T_{ph3}$ ($\Delta T_{ph3,0}$) at $T_2$. In some examples, error state circuit 404 also maintains internal clock signal 314 in the deasserted state.

Between time $T_3$ and $T_4$, error state circuit 404 receives a fourth cycle of clock signal 105 (having the cycle period $T_{ph4,0}$). Responsive to receiving the fourth cycle, error state circuit 404 can provide a state signal 412 having a state of $S_3$. Error parser circuit 406 also receives state signal 412 having the $S_3$ state and error signal 410. Responsive to state signal 412 having the $S_3$ state, error parser circuit 406 can provide error signal 410 received between $T_3$ and $T_4$ as error signal 312N representing an error of $T_{R,0}$ ($\Delta T_{R,0}$) at $T_3$. In some examples, error state circuit 404 also maintains internal clock signal 314 in the deasserted state.

A new set of cycle periods ($T_{ph1,1}$, $T_{ph2,1}$, $T_{ph3,1}$, and $T_{R,1}$) and error generation operations can start at $T_4$. At $T_4$, error parser circuit 406 can provide the error signals 410 received and stored between $T_0$ and $T_4$, including $\Delta T_{ph1,0}$, $\Delta T_{ph2,0}$, $\Delta T_{ph3,0}$, and $\Delta T_{R,0}$, as updated error signals 312a, 312b, 312c, and 312d. In some examples, error parser circuit 406 can also assert internal clock signal 314 again, which can signal to error processing circuit 304 to process the updated error signals.

FIG. 5 is a schematic of a delay circuit 420 of error detection circuit 402, in accordance with various examples. In an example, the delay circuit 420 includes a coarse delay stage 502 and a fine delay stage 504 coupled in series/cascade to generate clock signal 426 by delaying clock signal 105 by a delay $T_D$. In some examples, fine delay stage 504 follows coarse delay stage 502 in cascade fashion as indicated in FIG. 5, and in other examples fine delay stage 504 precedes coarse delay stage 502 in cascade fashion. Coarse delay stage 502 allows adjustment of delay $T_D$ in relatively large steps, and fine delay stage 504 allows adjustment of delay $T_D$ in relatively small steps. In some examples, coarse delay stage 502 can include a set of cascades of inverters/buffers, and coarse delay adjustment can be implemented by selectively multiplexing a different number of inverters into the delay path. In some examples, fine delay stage 504 can include a buffer (or cascades of buffers) and a capacitor having adjustable capacitance coupled to the buffer, and fine delay adjustment can be implemented by adjusting the capacitance of the capacitor. In some examples, control signal 428 can be in the form of a digital signal, where coarse delay stage 502 can receive and be programmed by a coarse control contained within control signal 428, and fine delay stage 504 can receive and be programmed by a fine control signal contained within control signal 428.

FIG. 6 is a schematic illustrating internal components of delay tuning circuit 424, in accordance with various examples. Referring to FIG. 6, delay tuning circuit 424 can include a digital filter 602 (which may include a decimator, accumulator, and/or other filtering), a delta-sigma circuit 604, and a dynamic element matching (DEM) circuit 606, to generate control signal 428 in digital form. In a case where delay tuning circuit 424 generates an analog control signal 428, delay tuning circuit 424 may further include a DAC 608 and an analog filter 610 to convert the digital control signal 428 into an analog control signal 628, which may be referred to elsewhere herein as control signal 428.

In an example of operation, delay tuning circuit 424 receives samples of error signal 410 from time measurement circuit 422. Digital filter 602 can perform various operations on the samples of error signal 410, such as a decimation/down sampling operation to reduce a sample rate to be processed by subsequent blocks of delay tuning circuit 424, which can reduce power consumption. Digital filter 602 can also perform lowpass filtering operations. However, the filtering demands may be different during steady-state operation in which low noise is required versus settling during initial operation or after a disturbance in which fast settling is required. In order to accommodate these two different cases, digital filter 602 can include a gear shifting mechanism such that lower gain is utilized during steady-state operation to achieve low noise, and higher gain is utilized to facilitate fast settling. In the case of lower gain for digital filter 602, the closed loop bandwidth of the delay tuning circuit 424 is reduced which leads to decreased noise but increased settling time. In the case of higher gain for digital filter 602, the closed loop bandwidth of the delay tuning circuit 424 is increased which leads to increased noise but decreased settling time.

Also, delta-sigma circuit 604 can reduce bit-width signal at its output and provide shaping of the resulting quantization noise, so that noise power can be concentrated at higher frequencies outside a frequency of interest (e.g., the bandwidth at which calibration signals 332a-N are updated). The output of delta-sigma circuit 604 is coupled to the input of DEM circuit 606, which converts the signal to a thermometer code with dynamic element operation applied. An example of dynamic element operation is barrel shifting a thermometer code. In case of analog control of 420, the output of DEM circuit 606 is coupled to the input of DAC 608, and the output of DAC 608 is coupled to the input of analog filter 610. In an example, analog filter 610 is a lowpass filter that removes high frequency noise introduced by the delta-sigma circuit 604 and DEM circuit 606.

Figure 7:
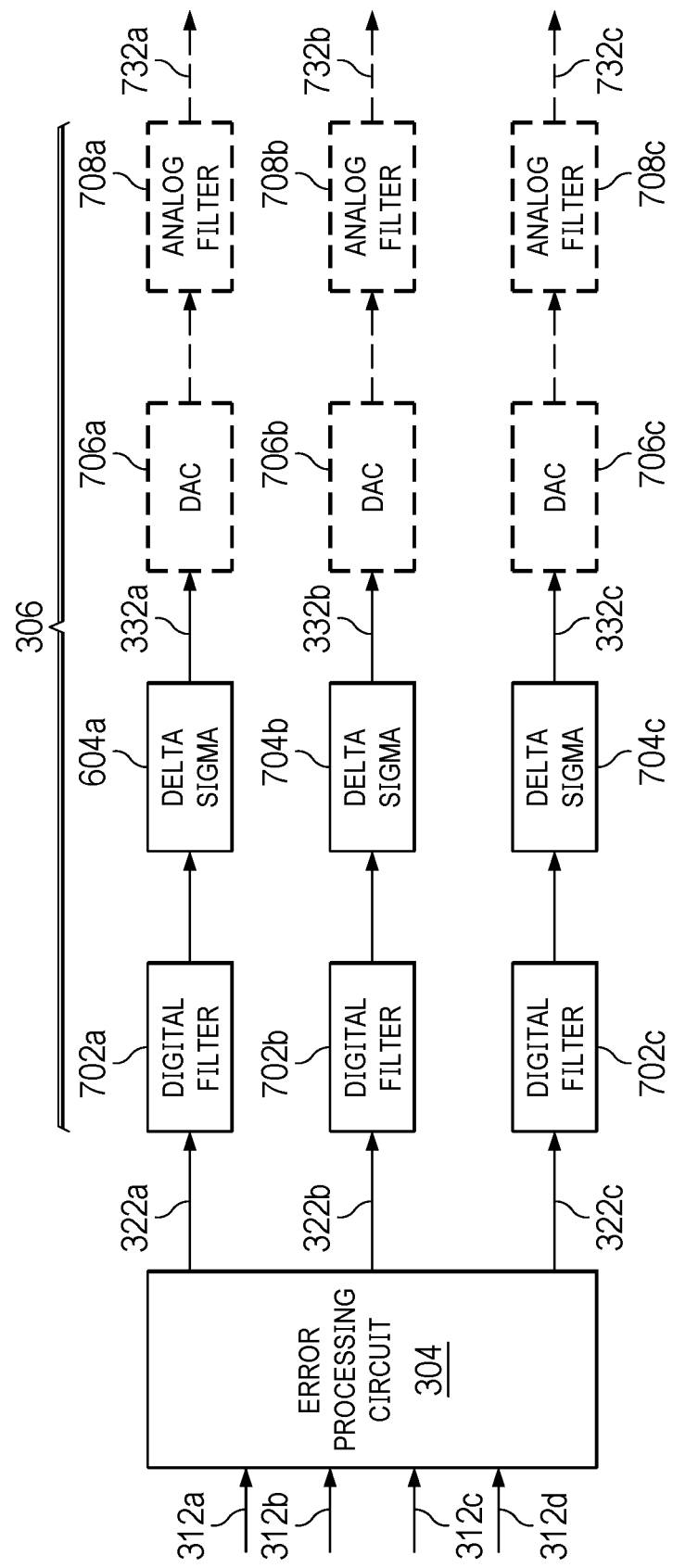

FIG. 7 is a schematic illustrating internal components of error processing circuit 304 and post-processing circuit 306 and their operations, in accordance with various examples. The example shown in FIG. 7 is for a case where clock multiplier 104 provides 4× frequency multiplication. Referring to FIG. 7, error processing circuit 304 can receive error signals 312a, 312b, 312c, and 312d, and generate processed signals 322a, 322b, and 322c. Processed signal 322a can target at the first cycle period $T_{ph1}$ and multiplier stage 206a, processed signal 322b can target at the second cycle period $T_{ph2}$ and multiplier stage 206b, and processed signal 322c can target at the third cycle period $T_{ph3}$ and multiplier stage 206c. The error corresponding to fourth cycle period $T_R$ is tuned implicitly since $T_R = T_{source} - (T_{ph1} + T_{ph2} + T_{ph3})$, where Tsource is the period of clock signal 103. Accordingly, the error signals have relationship $\Delta T_R = -(\Delta T_{ph1} + \Delta T_{ph2} + \Delta T_{ph3})$. As such, error signal $\Delta T_R$ implicitly converges to zero as $\Delta T_{ph1}$, $\Delta T_{ph2}$, and $\Delta T_{ph3}$ converge to zero during steady state operation of the calibration circuit 106.

In some examples, error processing circuit 304 can generate processed signal 322a based on error signal 312a, processed signal 322b based on error signal 312b, processed signal 322c based on error signal 312c, and discard error signal 312d. In some examples, error processing circuit 304 can generate processed signal 322a by subtracting error signal 312b from error signal 312a, processed signal 322b by subtracting error signal 312c from error signal 312a, and processed signal 322c by subtracting error signal 312d from error signal 312c, to facilitate convergence or, as to be described below, in a case where calibration circuit 106 receives a divided down version of clock signal 105 and sync signal 109. Specifically, prior to delay circuit 420 being tuned to provide a delay equal to the target cycle period, in a case where time measurement circuit 422 includes a bang-bang detector, period errors $\Delta T_{ph1}$, $\Delta T_{ph2}$, $\Delta T_{ph3}$, and $\Delta T_R$ may all exhibit either 1 values or −1 values depending on whether the delay circuit 420 has delay substantially less than or substantially greater than the target cycle period. This condition of having all 1 values or −1 values may not be representative of the actual error condition of $\Delta T_{ph1}$, $\Delta T_{ph2}$, $\Delta T_{ph3}$, and $\Delta T_R$ in such case. These non-zero period errors cause post-processing circuit 306 to adjust the multiplier stage delays in a manner that may not be beneficial for calibration since these non-zero period errors are not necessarily caused by multiplier stage delay mismatches/errors.

By generating processed signals corresponding to the subtraction of one of the error signals, such as error signal 312d, from error signals 312a, 312b, and 312c, we obtain error processed signals corresponding to $\Delta T_{ph1}-\Delta T_R$, $\Delta T_{ph2}-\Delta T_R$, and $\Delta T_{ph3}-\Delta T_R$.

In other examples, such as for the divider case discussed below, it may be beneficial to subtract error signals 312b, 312c, and 312d from error signal 312a to yield error processed signals corresponding to $\Delta T_{ph1}-\Delta T_R$, $\Delta T_{ph2}-\Delta T_R$, and $\Delta T_{ph3}-\Delta T_R$. Assuming this formulation for the error processed signals, undesired adjustment behavior caused by the untuned delay circuit 420 is avoided since the error processed signals yield a value of zero when all of the error signals (e.g., $\Delta T_{ph1}$, $\Delta T_{ph2}$, $\Delta T_{ph3}$, $\Delta T_R$) have value 1 or all of the error signals have value -1, as occurs when delay circuit 420 has delay substantially less than or greater than the target cycle period. As such, post-processing circuit 306 extracts tuning information indicative of actual multiplier stage delay errors, rather than improperly tuned delay circuit 420, from the processed signals and adjusts the multiplier stage delays accordingly. This can facilitate convergence, especially when delay circuit 420 is also in the midst of tuning.

Post-processing circuit 306 can include separate signal paths to generate delay calibration signal 332a for multiplier stage 206a, delay calibration signal 332b for multiplier stage 206b, and delay calibration signal 332c for multiplier stage 206c. For example, post-processing circuit 306 can include a digital filter 702a and a delta-sigma circuit 704a to post-process processed signal 322a to generate delay calibration signal 332a in digital form. Post-processing circuit 306 can also include a digital filter 702b and a delta-sigma circuit 704b to post-process processed signal 322b to generate delay calibration signal 332b in digital form. Also, post-processing circuit 306 can include a digital filter 702c and a delta-sigma circuit 704c to post-process processed signal 322c to generate delay calibration signal 332c in digital form. In some examples, post-processing circuit 306 can also include a DAC 706a and an analog filter 708a to convert digital delay calibration signal 332a into an analog delay calibration signal 732a, a DAC 706b and an analog filter 708b to convert digital delay calibration signal 332b into an analog delay calibration signal 732b, and a DAC 706c and an analog filter 708c to convert digital delay calibration signal 332c into an analog delay calibration signal 732c.

Post-processing circuit 306 can generate calibration signals 332/732 based on averaging the processed signals over any number sets of cycle periods. Referring again to FIG. 4C, in some examples, between times $T_4$ and $T_8$, post-processing circuit 306 can generate calibration signals 332a/732a based on averaging/accumulating $\Delta T_{ph1,0}$ of the most recent prior cycle period $T_{ph1,0}$ with error signals $\Delta T_{ph1}$ of other prior cycle periods $T_{ph1}$.

Figure 8:
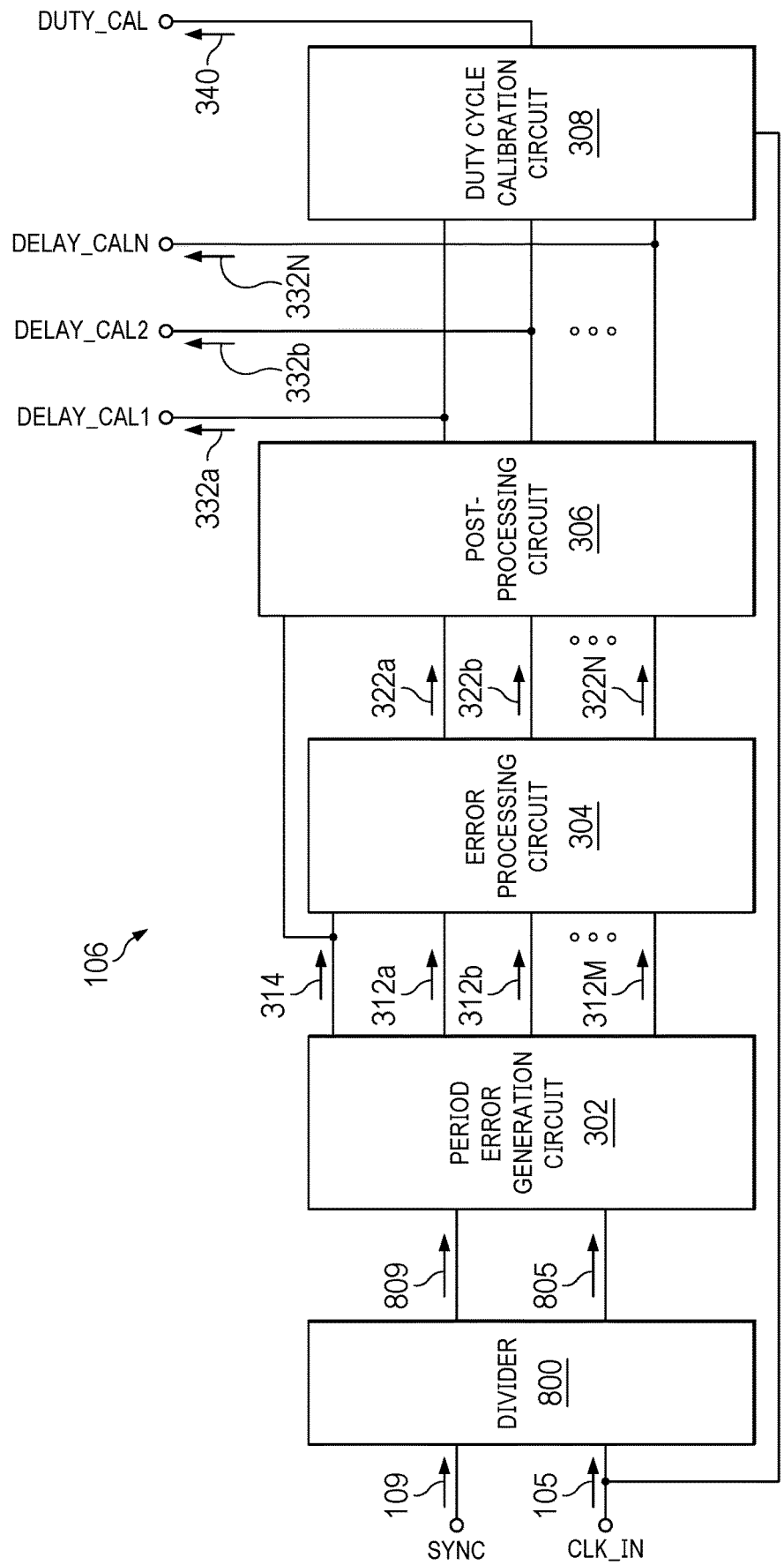
FIG. 8 is a schematic of another calibration circuit of FIG. 1, in accordance with various examples.

FIG. 8 is a schematic of another calibration circuit 106, in accordance with various examples. Referring to FIG. 8, calibration circuit 106 can include a divider 800 coupled between inputs CLK_IN and SYNC and period error generation circuit 302. Divider 800 can perform frequency divisions of clock signal 105 and sync signal 109 to generate, respectively, clock signal 805 and sync signal 809, so that clock signal 805 has a lower frequency than clock signal 105, and sync signal 809 has a lower frequency than sync signal 109. Period error generation circuit 302, error processing circuit 304, and post-processing circuit 306 can then determine cycle period errors and generate delay calibration signals 332a-N based on clock signal 805 and sync signal 809. By providing clock signal 805 and sync signal 809 having reduced frequencies to period error generation circuit 302, error processing circuit 304, and post-processing circuit 306, the operating frequencies of these circuits can be reduced, which can relax the speed requirements of these circuits and also reduce their power consumption.

In some examples, divider 800 can have a different divider value from the multiplication factor of clock multiplier 104. In one example, the divider value of divider 800 can be smaller than the multiplication factor of clock multiplier 104 by one. For example, in a case where clock multiplier 104 provides 4× frequency multiplication, divider 800 can provide 3× frequency division. Error detection circuit 402 also delays clock signal 805 by one target cycle period of clock signal 805. With such arrangements, error detection circuit 402 can provide a sequence of error signals 410 each including the error of a different cycle period of clock signal 105, and the error of each cycle period can be extracted by subtraction of error signals as to be described below.

Figure 9:
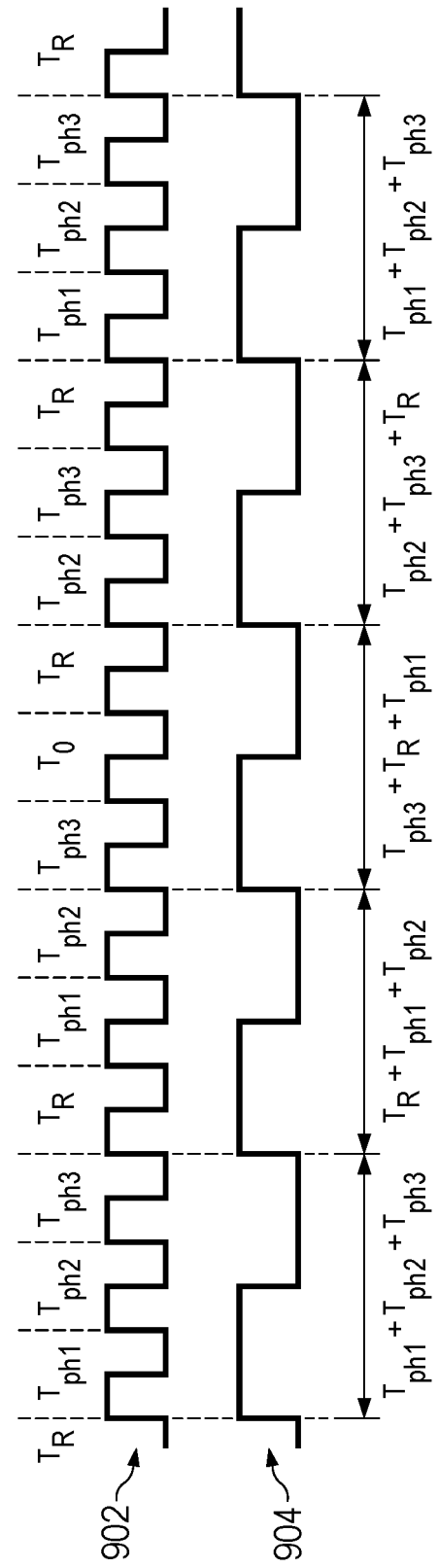
FIG. 9 and FIG. 10 are graphs that illustrate operations of the calibration circuit of FIG. 8, in accordance with various examples.
Figure 10:
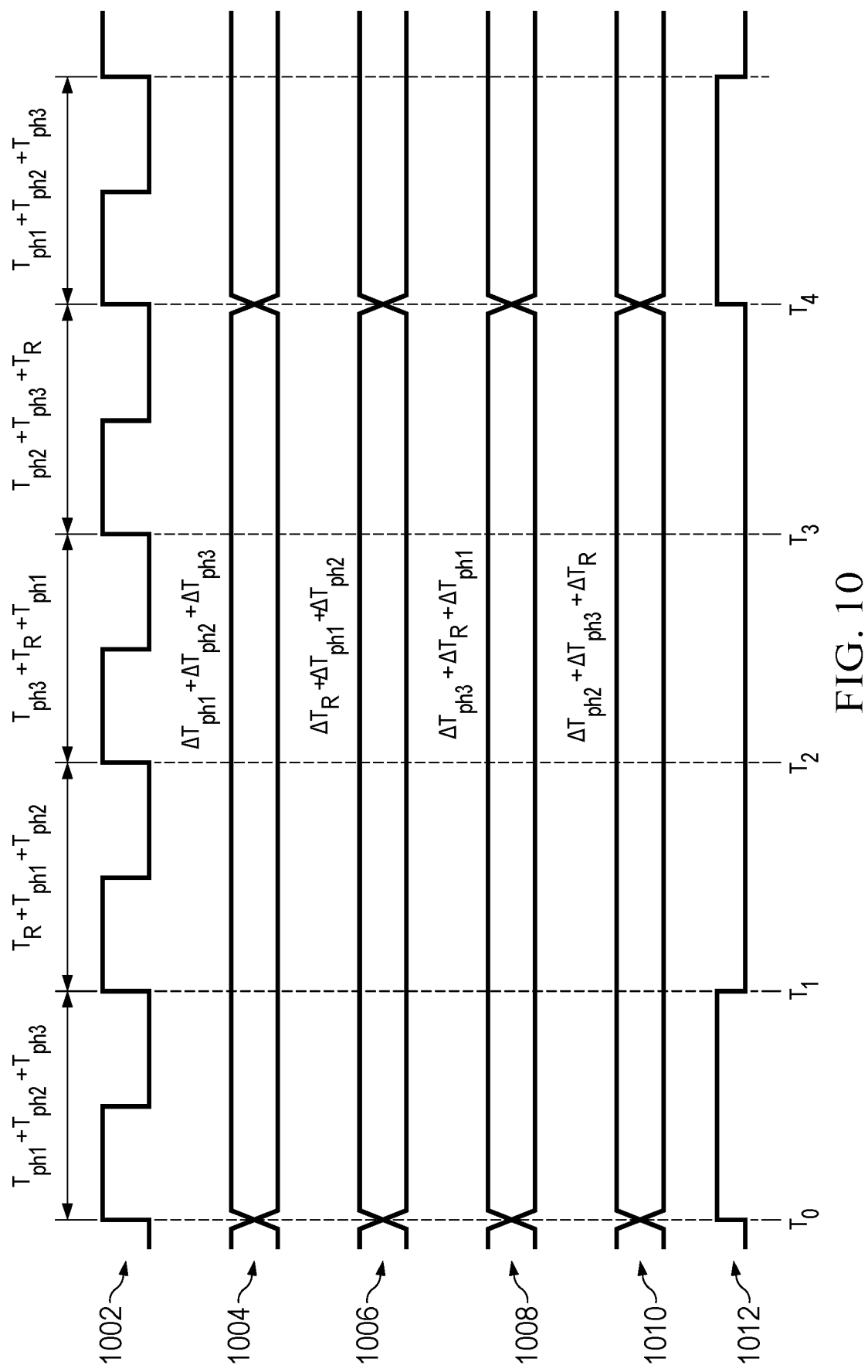

FIG. 9 and FIG. 10 include graphs that illustrate operations of calibration circuit 106 of FIG. 8, in a case where clock multiplier 104 provides 4× frequency multiplication and divider 800 provides 3× frequency division, in accordance with various examples. FIG. 9 includes graph 902 illustrating clock signal 105 and 904 illustrating clock signal 805. Referring to FIG. 9, because of the 3× frequency division, each cycle period of clock signal 805 spans across different combinations of three cycle periods of clock signal 105. For example, as shown in FIG. 9, a first cycle period of clock signal 805 spans $T_{ph1}+T_{ph2}+T_{ph3}$ of clock signal 105, a second cycle period of clock signal 805 spans $T_R+T_{ph1}+T_{ph2}$ of clock signal 105, a third cycle period of clock signal 805 spans $T_{ph3}+T_R+T_{ph1}$ of clock signal 105, and a fourth cycle period of clock signal 805 spans $T_{ph2}+T_{ph3}+T_R$ of clock signal 105.

FIG. 10 includes graphs 1002-1012 that illustrate operations of error parser circuit 406, in a case where clock multiplier 104 provides 4× frequency multiplication and divider 800 provides 3× frequency division. Graph 1002 represents clock signal 805, graph 1004 represents error signal 312a, graph 1006 represents error signal 312b, graph 1008 represents error signal 312c, graph 1010 represents error signal 312d, and graph 1012 represents internal clock signal 314 to synchronize the operations of error processing circuit 304 and post-processing circuit 306.

Between times $T_0$ and $T_1$ is a first cycle period of clock signal 805, which spans $T_{ph1}+T_{ph2}+T_{ph3}$ of clock signal 105. The error signal 410 received between $T_0$ and $T_1$ represents an error between $T_{ph1}+T_{ph2}+T_{ph3}$ and the target cycle period, which is represented by a sum of errors $\Delta T_{ph1}+\Delta T_{ph2}+\Delta T_{ph3}$, and error parser circuit 406 can store error signal 410 representing $\Delta T_{ph1}+\Delta T_{ph2}+\Delta T_{ph3}$. In this example, error parser circuit 406 also asserts internal clock signal 314 between $T_0$ and $T_1$, and deasserts internal clock signal 314 after $T_1$.

Between $T_1$ and $T_2$ is a second cycle period of clock signal 805, which spans $T_R+T_{ph1}+T_{ph2}$ of clock signal 105. The error signal 410 received between $T_1$ and $T_2$ represents an error between $T_R+T_{ph1}+T_{ph2}$ and the target cycle period, which is represented by a sum of errors $\Delta T_R+\Delta T_{ph1}+\Delta T_{ph2}$, and error parser circuit 406 can store error signal 410 representing $\Delta T_R+\Delta T_{ph1}+\Delta T_{ph2}$.

Also, between $T_2$ and $T_3$ is a third cycle period of clock signal 805, which spans $T_{ph3}+T_R+T_{ph1}$ of clock signal 105. The error signal 410 received between $T_2$ and $T_3$ represents an error between $T_{ph3}+T_R+T_{ph1}$ and the target cycle period, which is represented by a sum of errors $\Delta T_{ph3}+\Delta T_R+\Delta T_{ph1}$, and error parser circuit 406 can store error signal 410 representing $\Delta T_{ph3}+\Delta T_R+\Delta T_{ph1}$.

Further, between $T_3$ and $T_4$ is a fourth cycle period of clock signal 805, which spans $T_{ph2}+T_{ph3}+T_R$ of clock signal 105. The error signal 410 received between $T_3$ and $T_4$ represents an error between $T_{ph2}+T_{ph3}+T_R$ and the target cycle period, which is represented by a sum of errors $\Delta T_{ph2}+\Delta T_{ph3}+\Delta T_R$, and error parser circuit 406 can store error signal 410 representing $\Delta T_{ph2}+\Delta T_{ph3}+\Delta T_R$.

In this example, at $T_4$, error parser circuit 406 then asserts internal clock signal 314 again, and provides the stored error signals 410 as error signals 312, which signals to error processing circuit 304 to process error signals 312. At time $T_4$, error parser circuit 406 can provide error signal 312a representing $\Delta T_{ph1}+\Delta T_{ph2}+\Delta T_{ph3}$, error signal 312b representing $\Delta T_R+\Delta T_{ph1}+\Delta T_{ph2}$, error signal 312c representing $\Delta T_{ph3}+\Delta T_R+\Delta T_{ph1}$, and error signal 312d representing $\Delta T_{ph2}+\Delta T_{ph3}+\Delta T_R$.

As described above, error processing circuit 304 can determine the error for each cycle period of clock signal 105 ($T_{ph1}$, $T_{ph2}$, $T_{ph3}$, and $T_R$) by subtracting error signals 312b, 312c, and 312d from error signal 312a, as follows:

$$\text{signal\_322}a = \quad \text{(Equation 1)}$$
$$\text{signal\_312}a - \text{signal\_312}b = \Delta T_{ph1} + \Delta T_{ph2} + \Delta T_{ph3} -$$
$$(\Delta T_R + \Delta T_{ph1} + \Delta T_{ph2}) = \Delta T_{ph3} - \Delta T_R$$

$$\text{signal\_322}b = \quad \text{(Equation 2)}$$
$$\text{signal\_312}a - \text{signal\_312}c = \Delta T_{ph1} + \Delta T_{ph2} + \Delta T_{ph3} -$$
$$(\Delta T_{ph3} + \Delta T_R + \Delta T_{ph1}) = \Delta T_{ph2} - \Delta T_R$$

$$\text{signal\_322}a = \quad \text{(Equation 3)}$$
$$\text{signal\_312}a - \text{signal\_312}d = \Delta T_{ph1} + \Delta T_{ph2} + \Delta T_{ph3} -$$
$$(\Delta T_{ph2} + \Delta T_{ph3} + \Delta T_R) = \Delta T_{ph1} - \Delta T_R$$

Since the error signals have relationship $\Delta T_R = -(\Delta T_{ph1}+\Delta T_{ph2}+\Delta T_{ph3})$, error signal $\Delta T_R$ implicitly converges to zero as $\Delta T_{ph1}$, $\Delta T_{ph2}$, and $\Delta T_{ph3}$ converge to zero during steady state operation of the calibration circuit.

Figure 11:
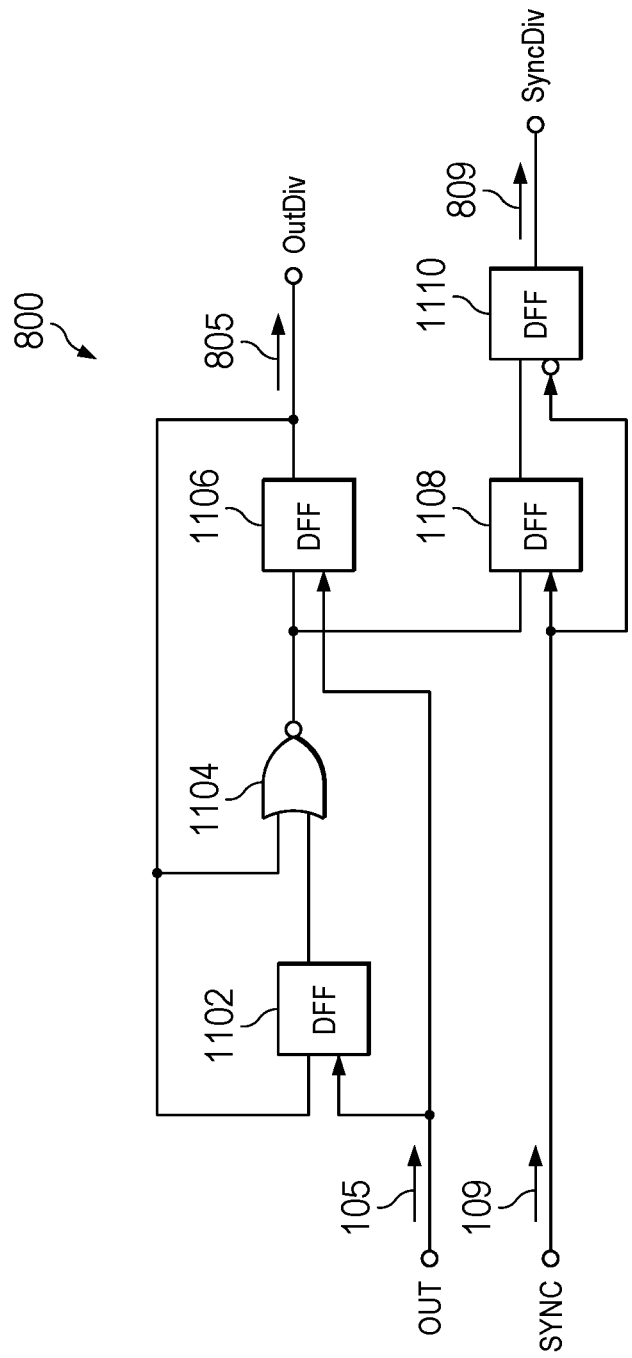
FIG. 11 is a schematic of an internal component of the calibration circuit of FIG. 8, in accordance with various examples.

FIG. 11 is a schematic of internal components of divider 800, in accordance with various examples. The example divider 800 in FIG. 11 provides 3× frequency division. In some examples, divider 800 can be implemented having a different divide ratio, such as for 2× frequency division, 4× frequency division, and other integer division values. The appropriate division value will be influenced by choice of multiplication value. In some examples, the division value will be chosen to be one less than the multiplication value, as discussed above. In some examples, a configurable divider circuit is implemented that supports different divide ratios, which may be particularly useful in cases where clock multiplier 104 supports variable multiplication factors.

Referring to FIG. 11, divider 800 includes a d-flip flop (DFF) 1102, a logic circuit 1104, a DFF 1106, a DFF 1108, and a DFF 1110. DFF 1102 has a data input, a clock input to receive a high frequency clock signal to be divided down (e.g., clock signal 105), and an output. Logic circuit 1104 has a first input coupled to the data input of DFF 1102, a second input coupled to the output of DFF 1102, and an output. In an example, the output of the logic circuit 1104 is an inverted output. In some examples, the inverted output is implemented by coupling an inverter (not shown) in series between the output of logic circuit 1104 and another component. DFF 1106 has a data input coupled to the output of logic circuit 1104, a clock input configured to receive clock signal 105, and an output coupled to the data input of DFF 1102. In an example, the output of DFF 1106 is an output of divider 800 to provide clock signal 805. DFF 1108 has a data input coupled to the output of the logic circuit 1104, a clock input to receive sync signal 109, and an output. DFF 1110 has a data input coupled to the output of the DFF 1108, a clock input receive sync signal 109, and an output. In an example, the clock input of the DFF 1110 is an inverted clock input. In some examples, the inverted clock input is implemented by coupling an inverter (not shown) to the clock input of the DFF 1110. In an example, the output of the DFF 1110 is an output of the divider 800 to provide sync signal 809.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus, comprising:
   a frequency multiplier having a frequency multiplier input, a frequency multiplier output, and a delay calibration input, the frequency multiplier having a first delay circuit having a delay control input coupled to the delay calibration input; and
   an error detection circuit having an input and a detection output, the input of the error detection circuit coupled to the frequency multiplier output, and the detection output coupled to the delay calibration input, the error detection circuit including a second delay circuit coupled between the input and detection output.

2. The apparatus of claim 1, wherein the first delay circuit has a signal input, the delay control input, and a delay signal output, and the frequency multiplier includes:
   a pulse generator circuit having an input and an output, the output of the pulse generator circuit coupled to the signal input; and
   a clock combination circuit having first and second inputs and an output, the first input coupled to the output of the pulse generator circuit, the second input coupled to the delay signal output, and the output of the clock combination circuit coupled to the frequency multiplier output.

3. The apparatus of claim 2, wherein the signal input is a first signal input, the delay control input is a first delay control input, the delay signal output is a first delay signal output;
   wherein the second delay circuit has a second signal input, a second delay control input, and a second delay signal output, the second signal input coupled to the input of the error detection circuit, and the second delay circuit configured to receive a first signal and provide a delayed version of the first signal at the second delay signal output by delaying the first signal responsive to a control signal at the second delay control input; and
   wherein the error detection circuit includes a time measurement circuit having first and second inputs and an output, the first input of the time measurement circuit coupled to the input of the error detection circuit, the second input of the time measurement circuit coupled to the second delay signal output, and the output of the time measurement circuit coupled to the detection output, the time measurement circuit configured to provide a second signal based on a time difference between a first edge of the first signal and a second edge of the delayed version of the first signal.

4. The apparatus of claim 3, wherein the second delay circuit is configured to delay the first signal by an interval equal to a period of the first signal responsive to the control signal.

5. The apparatus of claim 3, wherein the error detection circuit includes a tuning circuit having an input and an output, the input of the tuning circuit coupled to the detection output, the output of the tuning circuit coupled to the second delay control input, and the tuning circuit configured to generate the control signal responsive to the second signal.

6. The apparatus of claim 3, wherein the time measurement circuit include at least one of: a time-to-digital converter circuit, or a bang-bang detector circuit.

7. The apparatus of claim 2, further comprising a calibration circuit having an input and a calibration output, the input coupled to the detection output, and the calibration output coupled to the delay control input.

8. The apparatus of claim 7, wherein the signal input is a first signal input, the delay control input is a first delay control input, the delay signal output is a first delay signal output, and the pulse generator circuit includes a third delay circuit having a second signal input, a second delay control input, and a second delay signal output, the second signal input coupled to the input of the pulse generator circuit, and the second delay signal output coupled to the output of the pulse generator circuit; and
   wherein the calibration circuit includes a duty cycle calibration circuit having a duty cycle calibration output coupled to the second delay control input.

9. The apparatus of claim 8, wherein the duty cycle calibration circuit has an input coupled to one of: the calibration output, or the frequency multiplier output.

10. The apparatus of claim 7, wherein the frequency multiplier has a sync output coupled to the output of the pulse generator circuit or the delay signal output; and
    wherein the calibration circuit has a sync input coupled to the sync output, and the calibration circuit is configured to generate a control signal at the calibration output responsive to a sync signal at the sync input.

11. The apparatus of claim 3, wherein the frequency multiplier includes:
    a third delay circuit having a third signal input, a third delay control input, and a third delay signal output, the third signal input coupled to the first delay signal output; and
    a fourth delay circuit having a fourth signal input, a fourth delay control input, and a fourth delay signal output, the fourth signal input coupled to the third delay signal output, and the fourth delay signal output coupled to the frequency multiplier output.

12. The apparatus of claim 11, further comprising a divider having a divider input and a divider output, the divider input coupled to the frequency multiplier output, and the divider output coupled to the input of the error detection circuit.

13. The apparatus of claim 12, further comprising a calibration circuit having an input, a first calibration output, a second calibration output, and a third calibration output, the input of the calibration circuit coupled to the detection output, the first calibration output coupled to the first delay control input, the second calibration output coupled to the second delay control input, and the third calibration output coupled to the third delay control input,
   wherein the control signal is a first control signal, and the calibration circuit is configured to:
      determine a first cycle period error, a second cycle period error, a third cycle period error, and a fourth cycle period error of the first signal based on the second signal;

provide a second control signal at the first calibration output based on a difference between the second and first cycle period errors;

provide a third control signal at the second calibration output based on a difference between the third and first cycle period errors; and provide a fourth control signal at the third calibration output based on a difference between the fourth and first cycle period errors.

14. The apparatus of claim 12, wherein the frequency multiplier is configured to multiply a frequency of a second signal at the frequency multiplier input by a first number to generate the first signal at the frequency multiplier output; and wherein the divider is configured to divide a frequency of the first signal by a second number different from the first number to generate a third signal at the divider output.

15. The apparatus of claim 14, wherein the second number is lower than the first number by one.

16. An apparatus, comprising:

an error detection circuit having an input and an error detection output, the error detection circuit including:

a delay circuit having a signal input and a delay signal output, the signal input coupled to the input of the error detection circuit; and a time measurement circuit having first and second inputs and an output, the first input coupled to the input of the error detection circuit, the second input coupled to the delay signal output, and the output coupled to the error detection output; and a calibration circuit having an input and a delay calibration output, the input of the calibration circuit coupled to the error detection output.

17. The apparatus of claim 16, wherein the calibration circuit has a duty cycle calibration output.

18. The apparatus of claim 16, further comprising a duty cycle calibration circuit having a duty cycle calibration input and a duty cycle calibration output, the duty cycle calibration input coupled to the input of the error detection circuit.

19. The apparatus of claim 16, wherein the delay calibration output is a first delay calibration output, and the calibration circuit has a second delay calibration output and a third delay calibration output; and wherein the calibration circuit is configured to:

determine, based on states of the input of the calibration circuit, a first cycle period error, a second cycle period error, and a third cycle period error of a clock signal;

provide a first control signal at the first delay calibration output based on the first cycle period error;

provide a second control signal at the second delay calibration output based on the second cycle period error; and provide a third control signal at the third delay calibration output based on the third cycle period error.

20. The apparatus of claim 16, further comprising a divider having a divider input and a divider output, the divider output coupled to the input of the error detection circuit.

* * * * *